US012116670B2

(12) United States Patent
Matsunaga

(10) Patent No.: US 12,116,670 B2
(45) Date of Patent: Oct. 15, 2024

(54) SUBSTRATE PROCESSING METHOD AND SUBSTRATE PROCESSING APPARATUS

(71) Applicant: TOKYO ELECTRON LIMITED, Tokyo (JP)

(72) Inventor: Koichi Matsunaga, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 783 days.

(21) Appl. No.: 17/272,884

(22) PCT Filed: Aug. 9, 2019

(86) PCT No.: PCT/JP2019/031676
§ 371 (c)(1),
(2) Date: Mar. 2, 2021

(87) PCT Pub. No.: WO2020/049959
PCT Pub. Date: Mar. 12, 2020

(65) Prior Publication Data
US 2021/0317579 A1    Oct. 14, 2021

(30) Foreign Application Priority Data
Sep. 5, 2018   (JP) .................................. 2018-166108

(51) Int. Cl.
*C23C 16/52*    (2006.01)
*H01L 21/02*    (2006.01)

(52) U.S. Cl.
CPC ........ *C23C 16/52* (2013.01); *H01L 21/02118* (2013.01); *H01L 21/0228* (2013.01)

(58) Field of Classification Search
CPC ........................... C23C 16/52; H01L 21/0228; H01L 21/02118
See application file for complete search history.

(56) References Cited

U.S. PATENT DOCUMENTS

| 2010/0264115 | A1* | 10/2010 | Kawamura | C23C 16/455 269/53 |
| 2018/0025899 | A1* | 1/2018 | Kang | H01L 21/67196 216/89 |
| 2021/0223696 | A1* | 7/2021 | Achanta | G03F 7/165 |

FOREIGN PATENT DOCUMENTS

| JP | 2007-51335 A | 3/2007 |
| JP | 2016-46515 A | 4/2016 |
| WO | 2008/096717 A1 | 8/2008 |

OTHER PUBLICATIONS

Singh et al. Friction behaviour of chemical vapor deposited self-assembled monolayers on silicon wafer, Wear 262 (2007) 130-137. (Year: 2007).*

* cited by examiner

*Primary Examiner* — Kelly M Gambetta
(74) *Attorney, Agent, or Firm* — Nath, Goldberg & Meyer; Jerald L. Meyer; Tanya E. Harkins

(57) ABSTRACT

A method includes: supporting a rear surface of a substrate with a front surface thereof oriented upward to form a gap between the rear surface and a guide surface facing the rear surface; exhausting the gas outward of the substrate; and forming a thin film on the rear surface through vapor deposition by supplying a raw material gas from a side of the guide surface into the gap via a gas ejection port and heating the gas. The method has at least one of conditions including (a) the forming includes changing, during film formation, a height of the gap from one of a first value and a second value smaller than the first value to the other, and (b) the forming includes changing, during film formation, a ratio of flow rates of the gas ejected from first and second gas ejection ports formed at different radial positions on the substrate.

8 Claims, 9 Drawing Sheets

US 12,116,670 B2

SUBSTRATE PROCESSING METHOD AND SUBSTRATE PROCESSING APPARATUS

This is a National Phase Application filed under 35 U.S.C. 371 as a national stage of PCT/JP2019/031676, filed Aug. 9, 2019, an application claiming the benefit of Chinese Application No. 2018-166108, filed Sep. 5, 2018, the content of each of which is hereby incorporated by reference in its entirety.

TECHNICAL FIELD

The present disclosure relates to a substrate processing method and a substrate processing apparatus.

BACKGROUND

Patent Document 1 discloses that when a substrate is heated for heat treatment in a state of not being sufficiently exposed to an HMDS gas in the course of hydrophobizing a front surface of the substrate, the hydrophobicity of the substrate does not increase as expected, even if the temperature of the heat treatment is raised. Therefore, a substrate is hydrophobized as follows. First, the substrate is horizontally disposed that the front surface thereof faces upward inside a processing space while being supported by support pins kept in a raised position, and in this state, a processing gas is supplied from a gas ejection port provided in the central portion of an upper case. That is, the processing gas is supplied toward the front surface of the substrate in the state in which the substrate is disposed at an upper position spaced apart from a hot plate. The temperature of the processing gas at this time is, for example, 15 to 30 degrees C. Subsequently, the support pins are lowered to place the substrate on the hot plate, and the temperature of the front surface of the substrate is raised to 60 to 80 degrees C.

According to this method, the substrate can be hydrophobized at an expected level in a sufficient stable manner according to the heat treatment temperature of the substrate.

PRIOR ART DOCUMENTS

Patent Documents

Patent Document 1: Japanese Laid-Open Patent Publication No. 2016-046515

SUMMARY

The present disclosure has been made considering the above circumstances, and provides a technique capable of forming a thin film on a rear surface of a substrate with good in-plane uniformity in film thickness in a method of processing, using gas, a front surface of a substrate on which a semiconductor device is formed.

The present disclosure relates to a substrate processing method of processing a substrate with gas inside a processing container, the substrate having a front surface on which a semiconductor device is formed, the method including: supporting, by a support part, a rear surface of the substrate with the front surface oriented upward, so as to form a gap between the rear surface of the substrate and a guide surface facing the rear surface; exhausting an interior of the processing container from an exhaust port formed beyond the substrate supported by the support part along a circumferential direction of the processing container to exhaust the gas; and forming a thin film on the rear surface of the substrate through a vapor deposition by supplying a raw material gas from a side of the guide surface into the gap via a gas ejection port and heating the raw material gas, wherein the substrate processing method has at least one of following conditions: (condition a) the forming the thin film includes changing, during a film formation, a height of the gap from one of a first value and a second value smaller than the first value to the other, and (condition b) the forming the thin film includes changing, during the film formation, a ratio of flow rates of the raw material gas ejected from a first gas ejection port and a second gas ejection port formed at different positions on the substrate in a radial direction.

According to the present disclosure, it is possible to form a thin film on a rear surface of a substrate with good in-plane uniformity in film thickness in a method of processing, using gas, a front surface of a substrate on which a semiconductor device is formed.

DETAILED DESCRIPTION

Figure 1:
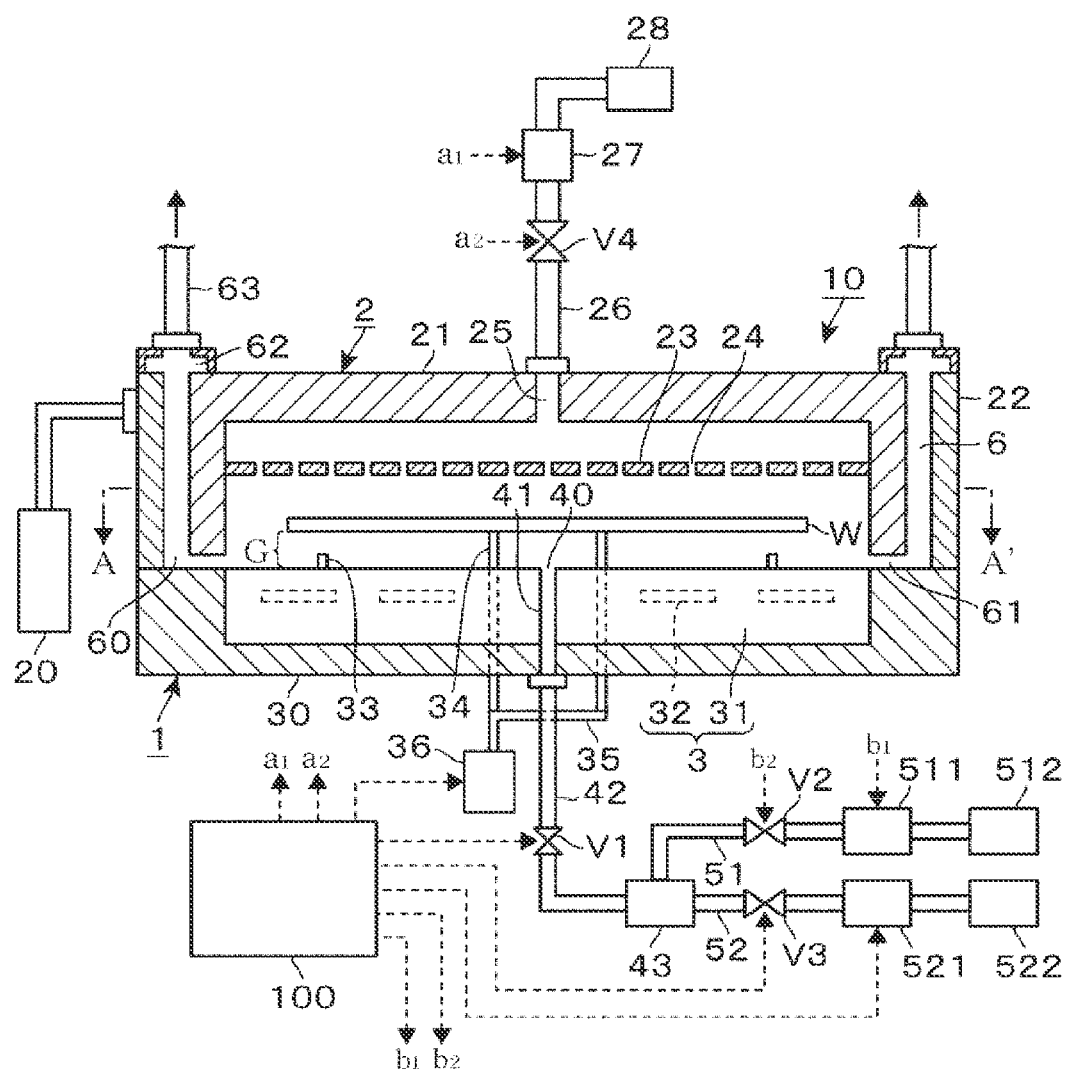
FIG. 1 is a vertical cross-sectional view illustrating a substrate processing apparatus according to an embodiment of the present disclosure.

As illustrated in FIG. 1, a substrate processing apparatus according to an embodiment of the present disclosure includes a lower member 1 and an upper member 2. The lower member 1 and the upper member 2 constitute a processing container 10. The lower member 1 includes a disk-shaped hot plate 3 having a radius larger than that of a semiconductor wafer (hereinafter referred to as "wafer") W, which is a substrate, and a flat cylindrical outer part 30 that surrounds the hot plate 3, except for an upper surface of the hot plate 3.

The hot plate 3 includes a plate-shaped part 31, and a heater 32 provided inside the plate-shaped part 31 and made of a resistance-heating element constituting a heating part. For example, the heater 32 may be configured to be divided into a plurality of concentric circles centered at the center of the hot plate 3, and to be able to heat a surface of the hot plate 3 with high thermal uniformity. In FIG. 1, the resistance-heating heater 32 is illustrated as being divided into two for the sake of convenience in illustration.

Figure 2:
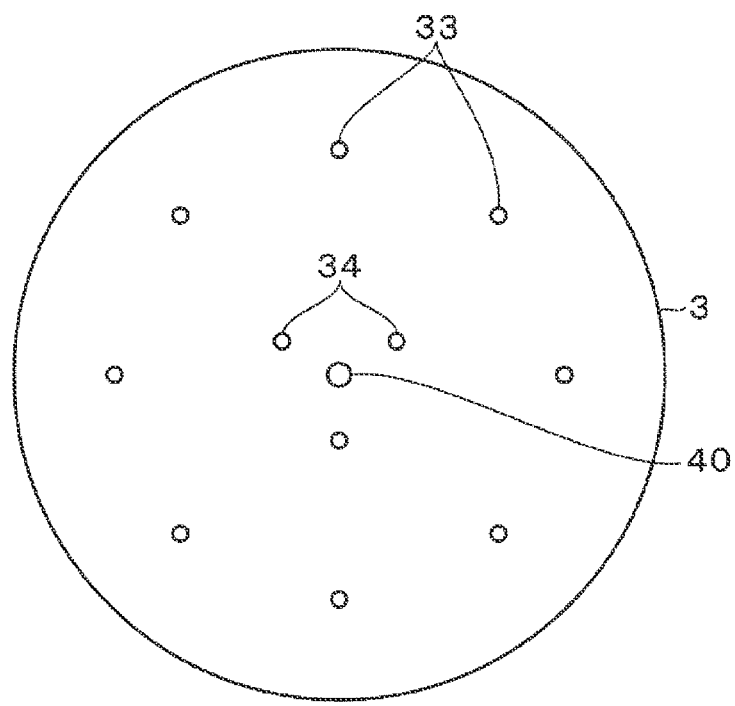
FIG. 2 is a plan view illustrating a hot plate used in the substrate processing apparatus illustrated in FIG. 1.

As illustrated in FIGS. 1 and 2, a plurality of (e.g., eight) gap pins 33 are provided on the surface of the hot plate 3 along a circle having a radius shorter than that of the wafer, which is centered at the center of the hot plate 3. Each gap pin 33 is set to a height of, for example, 0.3 mm.

Three lifting pins 34 are provided in the hot plate 3 closer to the center than the gap pins 33 in the circumferential direction along a circle centered at the center of the hot plate 3 so as to penetrate the hot plate 3. The three lifting pins 34 are connected to a lifting mechanism 36 configured with, for example, an air cylinder, via a lifting member 35. In FIG. 1, for the sake of convenience in illustration, two gap pins 33 and two lifting pins 34 are illustrated.

A gas flow path 41 through which a raw material gas for vapor deposition (to be described later) flows is formed to penetrate the central portion of the hot plate 3. A leading end side of the gas flow path 41 constitutes a gas ejection port 40 that opens in the central portion of the hot plate 3. That is, the outlet of the gas flow path 41 constitutes the gas ejection port 40. In addition, a base end side of the gas flow path 41 penetrates the central portion of an outer part 30, and is connected to a raw material gas supply pipe 42. A base end side of the raw material gas supply pipe 42 is connected to a vaporizer 43 via a valve V1. The vaporizer 43 is provided so as to vaporize a liquid raw material using a carrier gas, and is connected to a liquid raw material supply pipe 51 and a carrier gas supply pipe 52. In this example, a nitrogen gas is used as the carrier gas.

A valve V2, a flow rate adjuster 511, and a liquid raw material source 512 are connected to the liquid raw material supply pipe 51 in the named order from the downstream side. A valve V3, a flow rate adjuster 521, and a carrier gas source 522 are connected to the carrier gas supply pipe 52 in the named order from the downstream side.

As the liquid raw material, polytetrafluoroethylene (PTFE), which is a fluororesin, for example, Teflon (registered trademark), is used.

The upper member 2 is provided with a flat cylindrical lid part 21 so as to cover an upper space of the lower member 1. A bottom surface of a peripheral wall portion 22 of the lid part 21 is formed so as to overlap an upper surface of the outer part 30. The lid part 21 is configured to be capable of being raised and lowered, by a lifting mechanism 20, between a position where the lid part 21 overlaps the lower member 1 and a position where the wafer W is delivered between an external substrate transfer mechanism and the lifting pins 34.

The lid part 21 is provided with a gas dispersion plate 23 so as to vertically partition a space surrounded by the peripheral wall portion 22 of the lid part 21. An upper side and lower side of the gas dispersion plate 23 form a gas diffusion space and a processing space, respectively. In this example, the gas dispersion plate 23 has gas ejection holes 24 formed over the entire processing space in a plan view.

A gas flow path 25 is formed to penetrate the central portion of an upper surface plate of the lid part 21. A lower end of the gas flow path 25 opens to the above-mentioned diffusion space. An upper end of the gas flow path 25 is connected to a purge gas supply pipe 26. A valve V4, a flow rate adjuster 27, and a purge gas source 28 are connected to the purge gas supply pipe 26 in the named order from the downstream side. In this example, a nitrogen gas is used as the purge gas. In addition, the gas dispersion plate 23 and the gas flow path 25 constitute a purge gas supply part.

Figure 3:
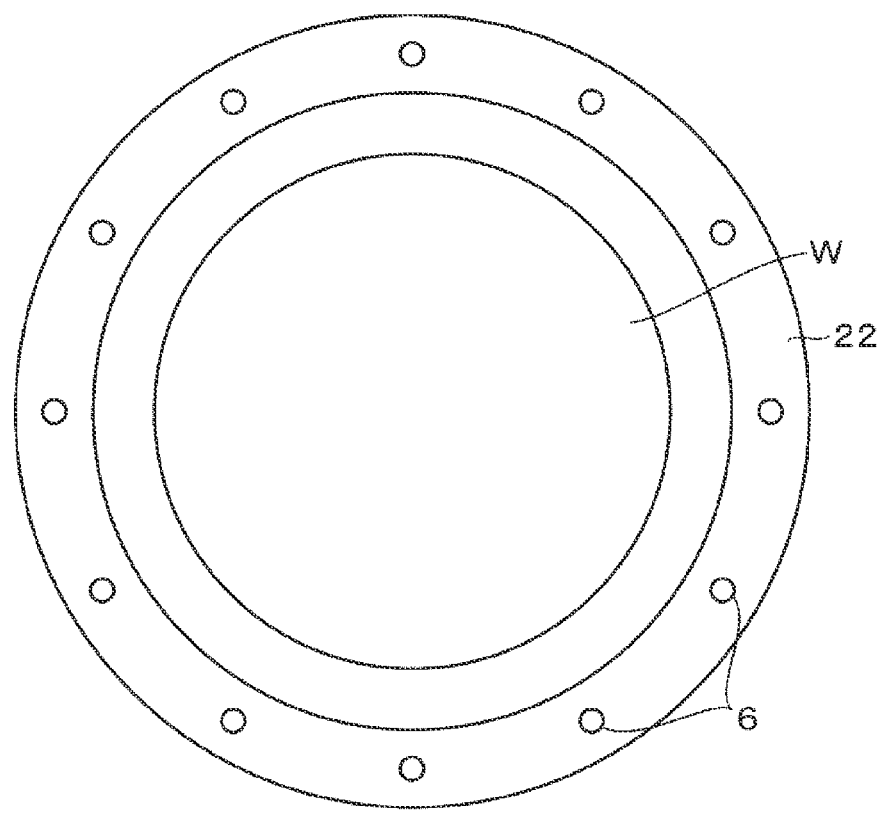
FIG. 3 is a transverse plan view of the substrate processing apparatus, taken along line A-A' in FIG. 1.

As illustrated in FIGS. 1 and 3, a plurality of exhaust paths 6, which vertically penetrate vertically the peripheral wall portion 22 of the lid part 21, are arranged inside the peripheral wall portion 22 of the lid part 21 along the circumferential direction of the lid part 21. On the bottom surface of the peripheral wall portion 22, a portion near the center of the lid part 21 including the exhaust paths 6 is cut off over the entire circumference thereof. A stage portion 61 is formed in the lower portion of the peripheral wall portion 22 when viewed from the side of the processing space. Therefore, the lower ends of the exhaust paths 6 open to the stage portion 61 so as to form exhaust ports 60. An annular exhaust room 62 is provided along the circumferential direction on the peripheral portion of the upper surface of the lid part 21. Upper ends of the exhaust paths 6 open at a bottom portion of the exhaust room 62. A plurality of exhaust pipes 63 are connected to the exhaust room 62 along the circumferential direction. Downstream ends of the exhaust pipes 63 are connected to, for example, an exhaust duct to which exhaust paths of each section in a factory are commonly connected.

The substrate processing apparatus according to an embodiment of the present disclosure includes a controller 100 configured by a computer. A storage part of the controller 100 stores a program for executing an operation to be described later. The program is installed on the storage part via a storage medium such as a compact disk, a memory card, a magneto-optical disk or the like. FIG. 1 illustrates some of control lines to which control signals are sent from the controller 100. The lifting mechanism 36 of the lifting pins 34, the valves V1 to V4, and the flow rate adjusters 27, 511, and 521 are controlled by the controller 100.

Next, the operation of the above-mentioned substrate processing apparatus will be described. First, the lid part 21 is raised to open the processing container 10, and the wafer W having a front surface on which a semiconductor device is formed is transferred to an area above the hot plate 3 by a substrate transfer mechanism (not illustrated), and is delivered from the substrate transfer mechanism to the lifting pins 34. After the substrate transfer mechanism is withdrawn outward of the processing container 10, the lid part 21 is lowered to close the processing container 10 (the state illustrated in FIG. 1). The wafer W is supported by the lifting pins 34 in a state in which a distance between the rear surface of the wafer W and the front surface of the hot plate 3, that is, a height of a gap G as indicated in FIG. 1, is set to a first value, for example, 2 mm. At this time, the wafer W is placed such that the center of the wafer W coincides with the center of the hot plate 3, that is, the center of the gas ejection port 40, within a predetermined allowable range.

In an example, before the wafer W is delivered to the lifting pins 34, the hot plate 3 is heated by the heater 32 to a temperature (e.g., 50 to 180 degrees C.) higher than a temperature at which the raw material gas condenses and lower than a temperature at which Teflon, which is a liquid raw material, decomposes.

Then, the valve V4 is opened to supply the purge gas, which is a nitrogen gas, from the purge gas source 28 into the processing container 10. The purge gas is supplied from the gas flow path 25 in the central portion of the lid 21 to the front surface of the wafer W and an area outside the wafer W via the gas dispersion plate 23. In addition, the interior of the processing chamber 10 is exhausted through the exhaust paths 6.

Figure 4:
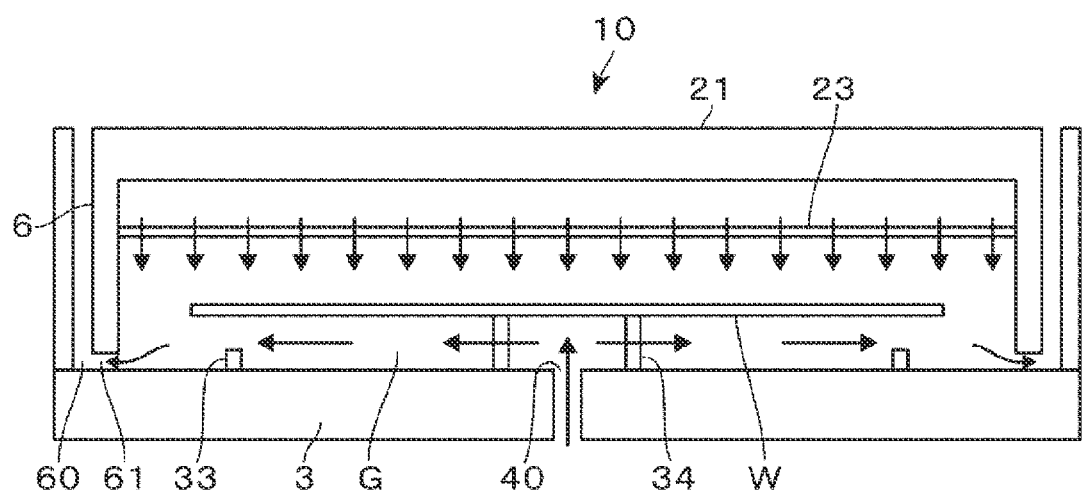
FIG. 4 is an explanatory view illustrating an operation of the substrate processing apparatus illustrated in FIG. 1.

In this state, as illustrated in FIG. 4, the raw material gas, which is a mixed gas of the Teflon gas (vapor) and the nitrogen gas, which is a carrier gas, is supplied from the gas ejection port 40 in the central portion of the hot plate 3 to the gap G between the rear surface of the wafer W and the hot plate 3 at a flow rate of, for example, 2.0 liters/minute.

The supply of the raw material gas will be described. The Teflon gas as a liquid raw material and the nitrogen gas as a carrier gas are sent from the liquid raw material supply pipe 51 and the carrier gas supply pipe 52 to the vaporizer 43, respectively. The Teflon is vaporized at the vaporizer 43, flows through the raw material gas supply pipe 42 together with the nitrogen gas, and is ejected from the gas ejection port 40.

The raw material gas ejected from the gas ejection port 40 diffuses over the entire circumference of the gap G between the rear surface of the wafer W and the hot plate 3, flows outward of the wafer W, flows into the exhaust paths 6 via the stage portion 61 provided in the lower portion of the lid part 22 together with the purge gas inflowing from the gas dispersion plate 23, and is exhausted from the processing atmosphere.

The lower ends of the plurality of exhaust paths 6 formed along the peripheral wall portion 22 of the lid part 21 open to the stage portion 61. The stage portion 61 is formed over the entire circumference of the peripheral wall portion 22. Therefore, the stage portion 61 between the exhaust paths 6 that are adjacent to each other serves as a so-called buffer area of the exhaust paths 6. The raw material gas and the purge gas are exhausted with high uniformity in the circumferential direction.

Since the raw material gas flows through the gap G, the Teflon, which is a raw material of vapor deposition, is deposited on the rear surface of the wafer W. The purge gas descending from the gas dispersion plate 23 flows around an area near the periphery of the rear surface of the wafer W, that is, the peripheral portion. For this reason, a gas flow of the raw material gas may be disturbed, which makes it difficult to diffuse the raw material gas widely over the rear surface of the wafer W. This may cause a case in which an area in which a Teflon film is not deposited appears on the peripheral portion. Thus, the in-plane uniformity of the film thickness is not stable. When the purge gas is not supplied, the Teflon film is formed on the peripheral portion of the rear surface of the wafer W. However, in the configuration of the apparatus illustrated in FIG. 1, the raw material may flow around the front surface of the wafer W, and thus a Teflon film may be formed in the formation area of the semiconductor device.

Figure 5:
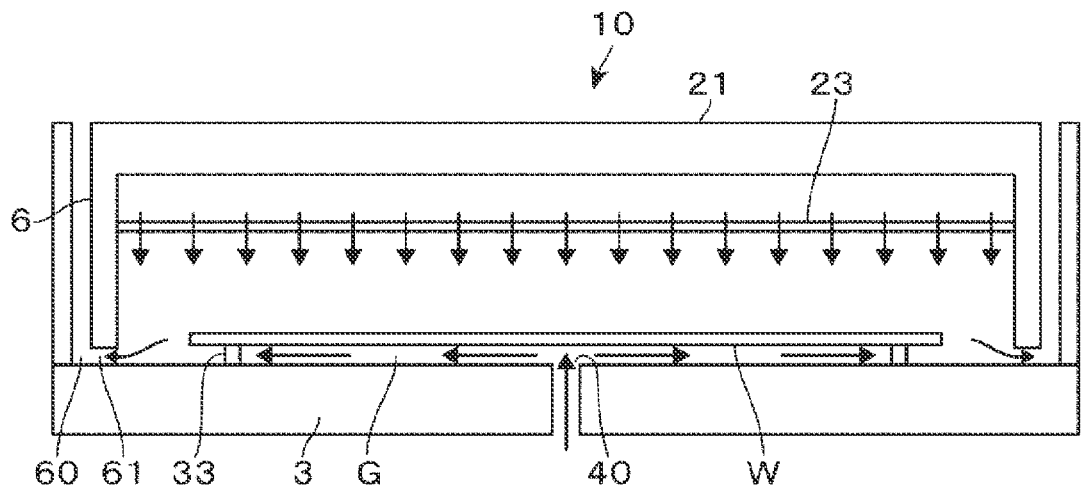
FIG. 5 is an explanatory view illustrating an operation of the substrate processing apparatus illustrated in FIG. 1.

Therefore, in this embodiment, as described above, vapor deposition is performed on the rear surface in the state in which the distance between the rear surface of the wafer W and the hot plate 3, that is, the height (dimension) of the gap G, is set to, for example, 2 mm (a first value), and subsequently, is performed in the state in which the distance between the rear surface of the wafer W and the hot plate 3 is set to be small, for example, 0.3 mm (a second value). In this example, the height of the gap pins 33 is 0.3 mm, and the height of the gap G is changed from 2 mm to 0.3 mm by lowering the lifting pins 34 to deliver the wafer W supported by the lifting pins 34 to the gap pins 33 as illustrated in FIG. 5. The lifting pins 34 are located below the front surface of the hot plate 3, but are not illustrated in FIG. 5.

Then, in the state in which the wafer W is supported by the gap pins 33, the raw material gas is supplied from the gas ejection port 40 to the gap G between the rear surface of the wafer W and the hot plate 3 at a flow rate of 1 liter/minute. When the gap G is made small in this manner, it becomes difficult for the purge gas to flow around the rear surface of the wafer W. Thus, the influence of the gas flow of the purge gas on the raw material gas is suppressed at the peripheral portion of the rear surface of the wafer W, which allows the vapor deposition to proceed so that the Teflon film is formed. The raw material gas also widely diffuses to the area closer to the center from the peripheral portion of the rear surface of the wafer W. However, since Teflon is not further laminated after a monomolecular film is formed, the Teflon is not laminated over the entire rear surface of the wafer W, but is laminated on the peripheral portion of the rear surface of the wafer W.

Here, the state in which the height of the gap G is large, in this example, the state in which the dimension is set to 2 mm, will be referred to as a wide gap state, and the state in which the dimension is small, in this example, the state in which the dimension is set to 0.3 mm, will be referred to as a narrow gap state. In this embodiment, first, the vapor deposition is performed in the wide gap state, and subsequently, is performed in the narrow gap state. That is, two steps of vapor depositions are performed. Therefore, it can be said that the second step is additionally performed on the peripheral portion of the rear surface of the wafer W to which the first step was not subjected.

For example, when one wishes to form a Teflon film on the rear surface of the wafer W only in the second step, if the raw material gas flows at a large amount of flow rate, the wafer W may float up because the gap G is narrow. Therefore, the raw material gas is required to be flown at a relatively small amount of flow rate. This reduces the vapor deposition rate of Teflon.

Meanwhile, when the first step is performed in the wide gap state and then the second step is performed in the narrow gap state, the vapor deposition rate in the second step increases. That is, when the second step is performed, since the Teflon film has already been formed on the area closer to the center than the peripheral portion of the rear surface of the wafer W, the consumption of the raw material gas in the area is suppressed. Therefore, the flow rate of the raw material gas supplied to the peripheral portion of the rear surface of the wafer W increases, and the vapor deposition rate at the peripheral portion increases. As a result, it is possible to quickly form a Teflon film, which is a resin film as a thin film, on the entire rear surface of the wafer W.

For example, a processing time required for the first step may be 180 seconds, and a processing time required for the second step may be 120 seconds.

After the second step is completed, the supply of the raw material gas is stopped, the lid part 21 is raised to open the space between the lid part 21 and the outer part 30, and the wafer W supported by the gap pins 33 is raised while being pushed up by the lifting pins 34. Subsequently, the external substrate transfer mechanism (not illustrated) enters below the wafer W, and the wafer W is delivered to the substrate transfer mechanism and is unloaded from the substrate processing apparatus in reverse order when the wafer W was loaded into the substrate processing apparatus.

The height of the gap G in the wide gap state, that is, the first value, is not limited to 2 mm, but may be set to a value selected from a range of, for example, larger than 0.5 mm and 7 mm or less. In addition, the height of the gap G in the narrow gap state, that is, the second value, is not limited to 0.3 mm, but may be set to a value selected from a range of, for example, 0.1 mm or more and 0.5 mm or less.

The roles of the lifting pins 34, the gap pins 33, and the hot plate 3 used in this embodiment will be additionally described later.

The lifting pins 34 and the gap pins 33 correspond to support parts for supporting the wafer W above the hot plate 3. When changing the height position of the wafer W, the gap pins 33 are not raised or lowered, but the lifting pins 34 are raised or lowered. Thus, it can be said that the controller 100 controls the support parts so as to change the height position of the wafer W with respect to the hot plate 3 during film formation.

In addition to the role of heating the raw material gas, the hot plate 3 serves to form the gap G for allowing the raw material gas to flow between the hot plate 3 and the rear surface of the wafer W, and to guide the raw material gas to the outer periphery of the wafer W along the rear surface of the wafer W. That is, the front surface of the hot plate 3 plays a role as a guide surface for the raw material gas. Therefore, in this embodiment, the hot plate 3 is an aspect of a guide surface formation member.

According to the above-described embodiment, there are the following effects. In the case in which the vapor deposition processing is performed only in the first step as described above, the in-plane uniformity in film thickness is not stable. In the case in which the vapor deposition processing is performed only in the second step, it takes a long time to form the Teflon film on the entire rear surface of the wafer W. Therefore, by performing the first step in the wide gap state and then performing the second step in the narrow gap state, the problem in the case of performing only the first step or in the case of performing only the second step can be settled. This makes it possible to quickly form the Teflon film on the entire rear surface of the wafer W with good in-plane uniformity in film thickness.

In the present disclosure, unlike the above example, the first step may be performed in the narrow gap state, and then the second step may be performed in the wide gap state. In this case, compared to a case in which the formation of the Teflon film on the wafer W is performed in the state in which the gap G is maintained constant without being changed during the film formation (in the wide gap state or in the narrow gap state), a large degree of freedom is secured in setting parameters, such as the flow rate of the raw material gas, in order to implement the in-plane uniformity in film thickness and shorten the overall processing time. Accordingly, it becomes easy to operate the apparatus, which makes it possible to implement the in-plane uniformity in film thickness and to shorten the processing time.

In Patent Document 1 described above, the processing gas is supplied to the substrate in the state in which the substrate is disposed at the upper position spaced apart from the hot plate. However, such a conventional method is different from the method of the present disclosure in that the processing gas is supplied to the front surface of the substrate from the gas ejection port provided in the central portion of the upper case and the processing gas is the HMDS gas for hydrophobic processing, and is also not a method of performing film formation processing. Therefore, the present disclosure is completely different from the method disclosed in Patent Document 1.

The formation of the Teflon film on the rear surface of the wafer W provides the following advantages. As one of semiconductor-manufacturing steps, there is an exposure processing. The exposure processing is performed in a state in which the wafer having a resist film formed on a front surface thereof is attracted onto a stage of an exposure device. A large number of pins are arranged on a surface of the stage of the exposure device. The wafer is placed on a group of the pins, and is suctioned to the stage by a vacuum chuck so that the wafer is flattened. In this state, exposure is performed.

Figure 6:
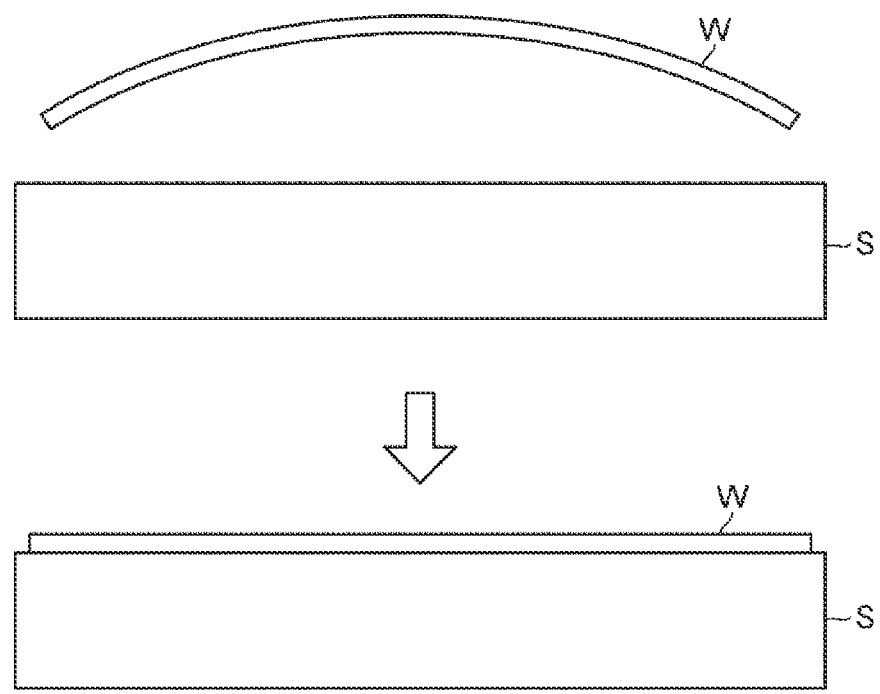
FIG. 6 is an explanatory diagram schematically illustrating a stage of an exposure device and a substrate mounted on the stage.

FIG. 6 is a view schematically illustrating a state in which a wafer W having a convexly-curved surface is attracted to a stage S. A large amount of stress is generated near the outer periphery of the wafer W attracted to the stage S, which may be one of causes of deteriorating pattern overlay.

By forming the Teflon film on the rear surface of the wafer W as in the present disclosure, the friction between the stage S and the wafer W is reduced. Therefore, the wafer W can be smoothly spread when being attracted to the stage S, which suppresses the wafer W from being stressed, and thus suppress the deterioration of the overlay.

In the present disclosure, instead of performing the first step in the wide gap state and then performing the second step in the narrow gap state, the first step may be performed in the narrow gap state, and then the second step may be performed in the wide gap state. In this case, the magnitude of the flow rate of the raw material gas is reversed. For example, the flow rate of the raw material gas in the first step may be set to 1.0 liter/minute, and the flow rate of the raw material gas in the second step may be set to 2.0 liters/minute.

Figure 7:
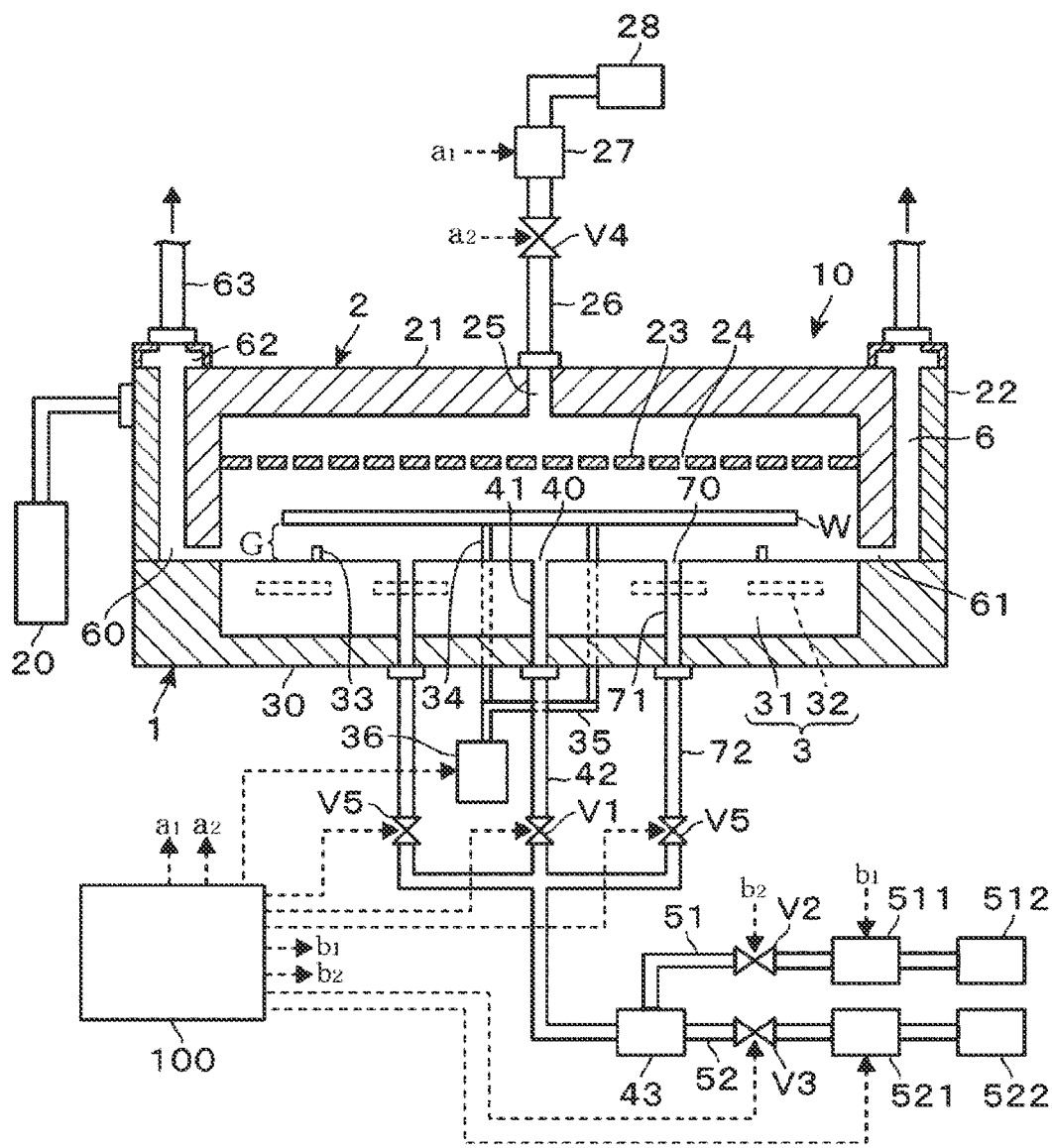
FIG. 7 is a vertical cross-sectional view illustrating a substrate processing apparatus according to another embodiment of the present disclosure.
Figure 8:
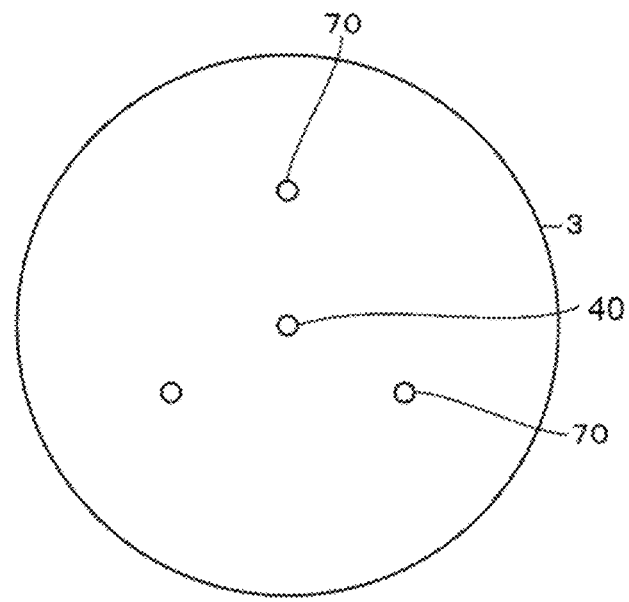
FIG. 8 is a plan view illustrating a hot plate used in the substrate processing apparatus illustrated in FIG. 7.

FIG. 7 illustrates a substrate processing apparatus according to another embodiment of the present disclosure. In this substrate processing apparatus, in addition to the configuration in which the gas flow path 41 is formed to penetrate the central portion of the hot plate 3, a gas flow path 71 is formed to penetrate the hot plate 3 at a position spaced apart from the central portion of the hot plate 3 toward the peripheral side. For example, three gas flow paths 71 are formed at equal intervals along a circle centered at the center of the hot plate 3 and having a radius smaller than that of the wafer W, which is about half the radius of the wafer W in this example. A leading end of each gas flow path 71 constitutes a gas ejection port 70, which open on the front surface of the hot plate 3. FIG. 8 illustrates the hot plate 3 in this example. In FIG. 8, the gap pins 33 and the lifting pins 34 are omitted.

A base end of each gas flow path 71 penetrates the outer part 30, and is connected to a raw material gas supply pipe 72. Base ends of the raw material gas supply pipes 72 merge with the above-mentioned raw material gas supply pipe 42 connected to the gas flow path 41 provided in the central portion of the hot plate 33, and are connected to the vaporizer 43. Each raw material gas supply pipe 72 is provided with a valve V5, the opening and closing of which is controlled based on a control signal from the controller 100. In FIG. 7, two gas flow paths 71 are illustrated for the sake of convenience in illustration. This substrate processing apparatus is the same as the substrate processing apparatus illustrated in FIG. 1, except that the gas flow paths 71 are provided and thus a structure related to the gas flow paths 71 is provided.

Figure 9:
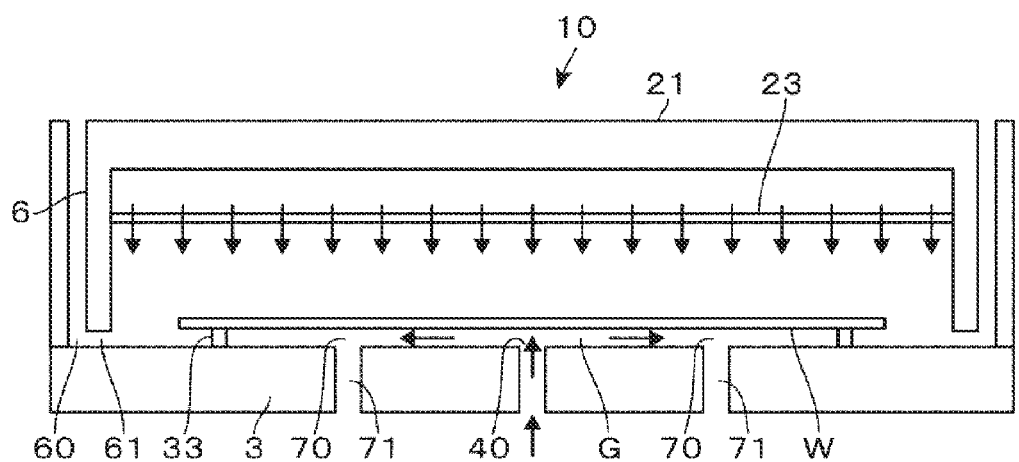
FIG. 9 is an explanatory view illustrating an operation of the substrate processing apparatus illustrated in FIG. 7.

Next, an operation of the substrate processing apparatus according to another embodiment of the present disclosure will be described. A gas ejection port 40 provided in the central portion of the hot plate 3 will be referred to as a "first gas ejection port 40", and three gas ejection ports 70 provided to be spaced outward from the central portion will be referred to as "second gas ejection ports 70". In this embodiment, the wafer W is delivered from an external substrate transfer mechanism to the gap pins 33 via the lifting pins 34. Then, the purge gas is supplied into the processing container 10 and exhaust is performed from the exhaust ports 60, as in the above-described embodiment. In this state, as illustrated in FIG. 9, a mixed gas of a Teflon gas and a carrier gas, which is a raw material gas, is supplied from the first gas ejection port 40 to the gap G between the rear surface of the wafer W and the hot plate 3 for a predetermined time at a flow rate of, for example, 1.0 liter/min. At this time, the valves V5 remain closed, and thus the raw material gas is not supplied from the second gas ejection ports 70.

Figure 10:
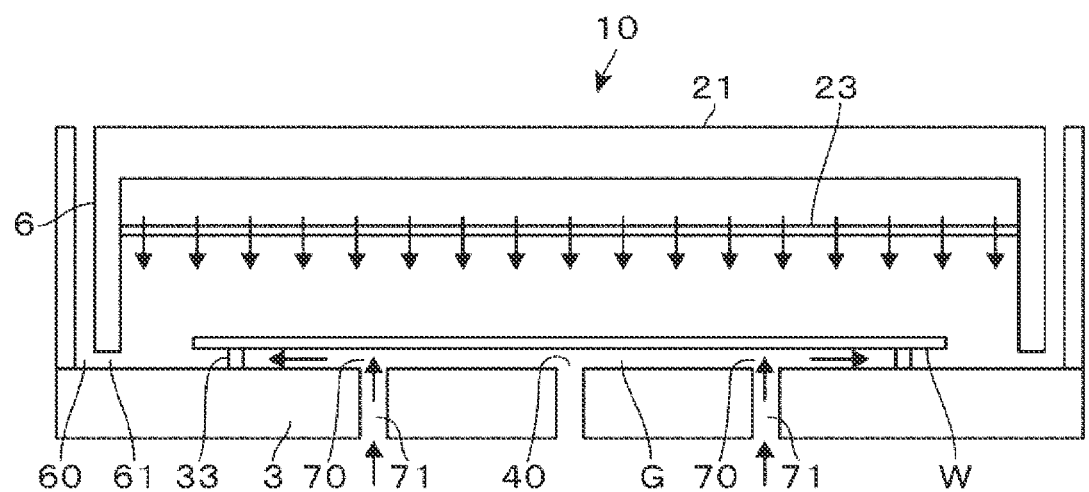
FIG. 10 is an explanatory view illustrating an operation of the substrate processing apparatus illustrated in FIG. 7.

Subsequently, the valve V1 is closed and the valves V5 are opened to stop the supply of the raw material gas from the first gas ejection port 40, and the raw material gas is supplied to the gap G from the second gas ejection ports 70, as illustrated in FIG. 10. The total flow rate of the raw material gas from the three gas ejection ports 70 is set to, for example, 1.0 liter/minute. Examples of the processing time of the vapor deposition may include 180 sec in the first step, and may include 120 sec in the second step.

Then, after the vapor deposition processing is performed for a predetermined time, the supply of the raw material gas is stopped, and the wafer W is carried out of the substrate processing apparatus, as described above.

In this embodiment, in the first step, the raw material gas is ejected from the first gas ejection port 40 in the narrow gap state. As a result, the vapor deposition rate on the peripheral portion of the rear surface of the wafer W is low. However, the Teflon film is rapidly formed on the central area of the rear surface. Then, in the second step, the raw material gas is ejected from the second gas ejection ports 70 in the narrow gap state. As a result, the Teflon film is quickly formed on the peripheral portion of the rear surface. Therefore, it is possible to quickly form the Teflon film on the entire rear surface of the wafer W with good in-plane uniformity in film thickness.

Figure 11:
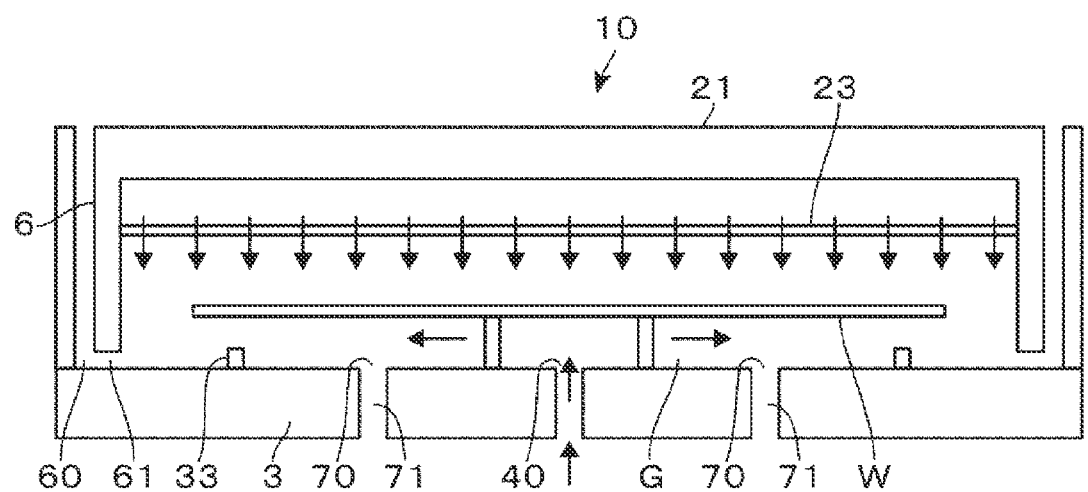
FIG. 11 is an explanatory view illustrating an operation of the substrate processing apparatus illustrated in FIG. 7.

In another embodiment described above, in the first step, the raw material gas is ejected from the first gas ejection port 40 in the narrow gap state. However, the first step may be performed in the wide gap state, as illustrated in FIG. 11. In this case, in the first step, the lifting pins 34 are raised to push up the wafer W on the gap pins 33, the height of the gap G is set to, for example, 2 mm, and the flow rate of the raw material gas is set to, for example, 2.0 liters/minute.

Figure 12:
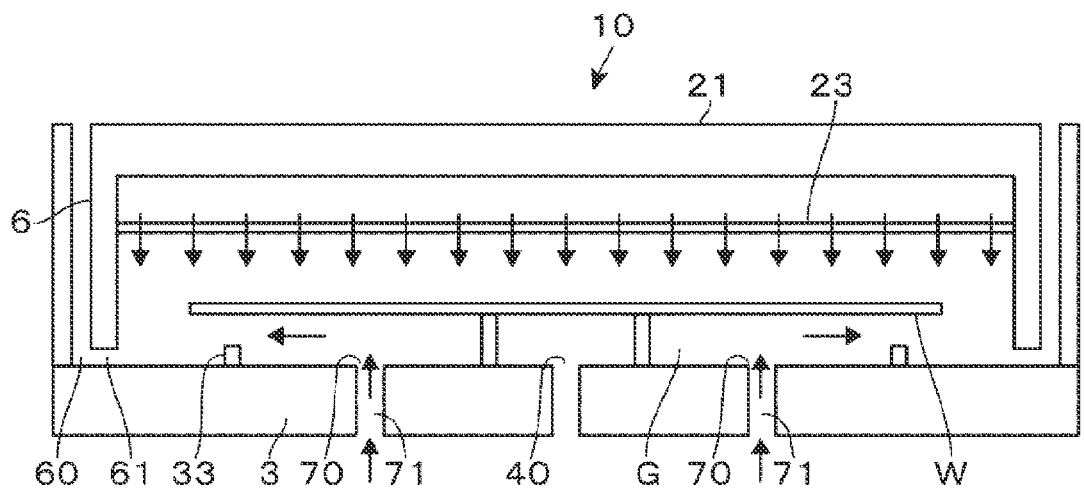
FIG. 12 is an explanatory view illustrating an operation of the substrate processing apparatus illustrated in FIG. 7.

Further, in the second step, instead of ejecting the raw material gas from the second gas ejection ports 70 in the narrow gap state, the raw material gas may be ejected in the wide gap state as illustrated in FIG. 12. In this case, in the second step, the wafer W is supported by the lifting pins 34, the height of the gap G is set to, for example, 2 mm, and the total flow rate of the raw material gas from the three gas ejection ports 70 is set to, for example, 2.0 liters/minute.

Therefore, in the case in which the vapor deposition processing is performed using the substrate processing apparatus illustrated in FIG. 7, the above description may be summarized as follows. That is, the first step and the second step may be combined as follows.

| First step | Second step |
| --- | --- |
| State of FIG. 9 | State of FIG. 10 |
| State of FIG. 11 | State of FIG. 10 |
| State of FIG. 9 | State of FIG. 12 |
| State of FIG. 11 | State of FIG. 12 |

In the present disclosure, when the vapor deposition processing is performed using the substrate processing apparatus illustrated in FIG. 7, the order of performing the vapor deposition processing corresponding to the first step and the vapor deposition processing corresponding to the second step may be reversed. That is, in this case, the above-mentioned second step becomes the first step, and the above-mentioned first step becomes the second step. This combination of steps is described below.

| First step | Second step |
| --- | --- |
| State of FIG. 10 | State of FIG. 9 |
| State of FIG. 10 | State of FIG. 11 |
| State of FIG. 12 | State of FIG. 9 |
| State of FIG. 12 | State of FIG. 11 |

The substrate processing apparatus of the present disclosure may adopt a configuration in which a plurality of gas ejection ports for the raw material gas are provided in the radial direction of the hot plate 3. An example of the substrate processing apparatus having such a configuration may be the substrate processing apparatus of FIG. 7. In addition, there is the example in which the raw material gas is supplied from one of the first gas ejection port 40 and the second gas ejection ports 70, and the supply of the raw material gas from the other is stopped. However, the raw material gas may be supplied from both the first gas ejection port 40 and the second gas ejection ports 70, and a ratio of the flow rate of the gas from the first gas ejection port 40 to the flow rate of the gas from the second gas ejection ports 70, that is, a gas flow rate ratio, may be changed between the first step and the second step. For example, in the case in which the raw material gas is supplied from both the gas ejection ports 40 and 70, a method of setting the flow rate of the raw material gas from the first gas ejection port 40 in the first step to a value suitable for vapor deposition in the central area of the wafer W, and setting the flow rate of the raw material gas from the second gas ejection ports 70 in the second step to a value suitable for vapor deposition in the peripheral area of the wafer, may be employed.

Meanwhile, in a case in which the ratio of the flow rates of the raw material gases from the first gas ejection port 40 and the second ejection ports 70 is not changed between the first step and the second step, there are the following disadvantages. That is, it is extremely difficult to reliably deposit Teflon on the peripheral area of the wafer W, to prevent the raw material gas from flowing around the front surface of the wafer W, and further to prevent the wafer W from floating.

In addition, the first gas ejection port 40, which is an ejection port used for vapor-depositing the raw material gas on the central area of the wafer W, is not limited to being provided in the central portion of the hot plate 3. For example, a plurality of first gas ejection ports may be provided in the vicinity of the central portion of the hot plate 3. The number of second gas ejection ports 70 is not limited to three, and may be two, or four or more.

The film forming method using the substrate processing apparatus of FIG. 1 is an example of a method of changing the height position of the wafer W from the front surface of the hot plate 3, that is, the height of the gap G, during film formation.

The film forming method using the substrate processing apparatus of FIG. 7 is an aspect of a method of changing, during film formation, the ratio of the flow rates of the gases ejected from the first gas ejection port 40 and the second gas ejection ports 70, using the first gas ejection port 40 and the second gas ejection ports 70, which are gas ejection ports for raw material gas provided at different positions in the radial direction of the wafer W. In addition, as an example of the film forming method using the substrate processing apparatus of FIG. 7, changing the ratio of the flow rates of the gases ejected from the first gas ejection port 40 and the second gas ejection ports 70, and changing the height of the gap G may be combined.

Therefore, the present disclosure relates to a substrate processing method that includes at least one of the following conditions:

(Condition a) changing, during film formation, the height position of the substrate with respect to the guide surface, and (Condition b) changing, during film formation, the ratio of the flow rates of the gases ejected from the first gas ejection port and the second gas ejection ports, which are provided at different positions in the radial direction of the substrate.

In the case in which the first gas ejection port 40 and the second gas ejection ports 70 provided at different positions in the radial direction of the wafer W are used, the substrate processing method is not limited to the example in which two groups, that is, the first gas ejection port 40 and the second gas ejection ports 70, are provided at different positions in the radial direction, as in the above-mentioned example. For example, the flow rates of the raw material gases may be changed, during film formation, using gas ejection ports of three groups, or four or more groups, which are provided at different positions in the radial direction. As an example, there may be a case in which a third gas ejection port located closer to the outer periphery of the wafer W than the second gas ejection ports 70 is provided.

In the above-described example, the thin film formed in the present disclosure is described as being the Teflon film obtained by laminating no film component on a monomolecular film after the monomolecular film is formed, but is not limited to the Teflon film. In a case in which a fluororesin film is formed as the thin film, the thin film is not limited to the polytetrafluoroethylene film, and may be another fluororesin such as perfluoroalkoxy alkane (PFA).

The thin film formed in the present disclosure is not limited to the fluororesin film, and may be another resin film, or a film other than the resin film. Further, in the above-described example, the thin film is used as a film playing a role of reducing the friction between the stage and the wafer during exposure of the wafer, but may be an auxiliary film playing another auxiliary role during the manufacture of a semiconductor device, for example, a protective film that protects the rear surface of the wafer.

The technology related to the present will be further additionally described later.

The flow rate of the purge gas supplied to the wafer W from above may be the same in the first step and the second step, but may be set to an appropriate value in each step. For example, when the flow rate of the raw material gas during film formation in the wide gap state is greater than the flow rate of the raw material gas during film formation in the narrow gap state, it may be possible to use a method of setting the flow rate of the purge gas in the wide gap state to be greater than that in the narrow gap state, from the viewpoint of preventing the raw material gas from flowing around the front surface of the wafer W and preventing the wafer W from floating.

The substrate processing method of the present disclosure is not limited to supplying the purge gas to the wafer W from above. For example, the air flow of the raw material gas may be optimized by changing the arrangement of the exhaust ports, the amount of gas exhausted, the structure around the wafer W, or the like, instead of supplying the purge gas.

Further, the orientation of the wafer W may be changed during film formation. The advantages of this method are as follows. There may be a case in which the gas flow in the entire internal area of the processing container 10 is not completely uniform, or a case in which the wafer W supported by the support parts (the gap pins 33 or the lifting pins 34) is slightly tilted from the horizontal posture. For this reason, there is a concern that a state in which a film is not likely to adhere to a partial area of the peripheral portion of the wafer W may become more apparent. Therefore, the orientation of the wafer W during film formation is changed so as to relatively change a portion where a film is likely to adhere and a portion where a film is not likely to adhere. As a result, the film may be uniformly formed on the peripheral portion of the wafer W in the circumferential direction.

An example of the method of changing the orientation of the wafer W may include a method of combining the hot plate 3 with a rotation mechanism so as to rotate the wafer W together with the hot plate 3. In this method, the supply of the raw material gas may be temporarily stopped during film formation, the hot plate 3 may be rotated to change the orientation of the wafer W in the state in which the wafer W is placed on the gap pins 33, and then the supply of the raw material gas may be resumed.

Another example of the method of changing the orientation of the wafer W may include a method of temporarily stopping the supply of the raw material gas during film formation, unloading the wafer W from the processing container 3 to change the orientation of the wafer W, loading the wafer W into the processing container 3 again, and resuming the supply of the raw material gas. In this method, a rotational stage used for the wafer W may be provided outside the processing container 3, and the orientation of the wafer W may be changed by the rotational stage. Alternatively, a holding stage having no rotation function may be provided, the wafer W may be placed on the holding stage, the orientation of a transfer mechanism may be changed to receive the wafer W from the holding stage, and then the orientation of the wafer W may be changed.

In the above-described embodiment, the wafer W is placed on the gap pins 33 in the narrow gap state, but the wafer W may be supported by the lifting pins 34 in the narrow gap state without using the gap pins 33.

In some embodiments, the height of the gap G may be changed by fixing the height position of the wafer W and moving the hot plate 3 up and down.

In some embodiments, instead of using the hot plate 3, a plate-shaped member having a raw material gas guide surface formed to face the rear surface of the wafer W, for example, a plate-shaped member made of quartz, may be used, and a heating lamp constituting a heating part may be provided below the plate-shaped member so as to heat the raw material gas with infrared rays transmitted from the heating lamp through the plate-shaped member.

Figure 13:
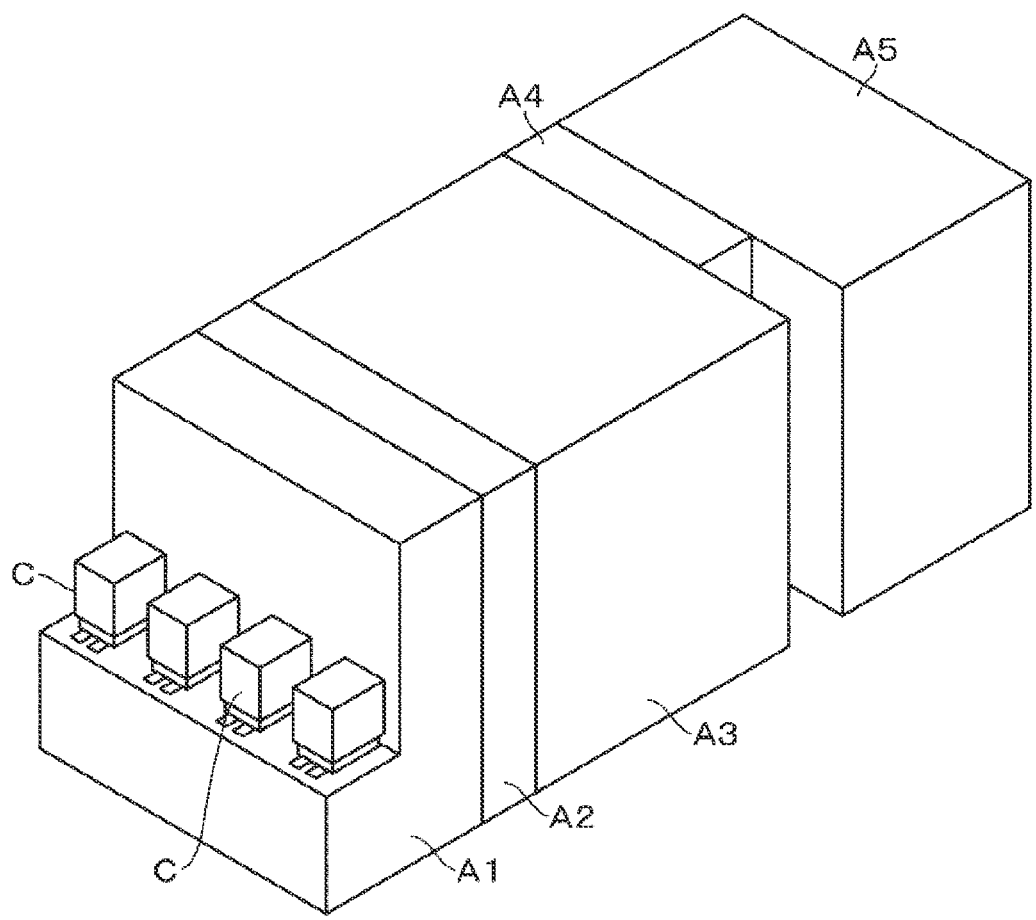
FIG. 13 is an external view illustrating an example of a coating/developing device, which is an object of an example of an arrangement of the substrate processing apparatus of the present disclosure.

Next, an application example of the substrate processing apparatus of the present disclosure will be described. As a system for forming a resist pattern, there is known a system in which an exposure device is connected to a coating/developing device configured to apply a resist to a wafer W and to develop the wafer after exposure. FIG. 13 is a schematic view illustrating the appearance of an example of the coating/developing device. The coating/developing device is configured by sequentially and linearly connecting a carrier block A1, an intermediate block A2, a processing block A3, and an interface block A4 in the horizontal direction. An exposurer A5 is connected to the interface block A4. A carrier C in which a wafer W used as a substrate is stored is transferred and placed on the carrier block A1 by a carrier transfer mechanism (not illustrated). The processing block A3 is provided with a coating module configured to supply a resist to a front surface of the wafer W used as a substrate, so as to form a resist film, a developing module configured to supply a developing solution to the exposed resist film so as to form a resist pattern, and the like. The intermediate block A2 is provided with an imaging module configured to image the entire front surface of the developed wafer W, and the like.

The wafer W stored in the carrier C is taken out by a wafer transfer mechanism, subjected to the formation of the resist film, the exposure, and the development, and then returned to the carrier C.

The substrate processing apparatus of the present disclosure is provided in, for example, the interface block A4 of the coating/developing device. A Teflon film is formed on a rear surface of the wafer W on which the resist film is formed. A series of processes of forming the resist film include a process of heating the wafer after a resist solution is applied. A heating module group for performing such a heating process is provided in the processing block A3. The substrate processing apparatus of the present disclosure may be arranged in an area where the heating module group is provided. In addition, the substrate processing apparatus of the present disclosure may be arranged as a separate and independent apparatus outside the coating/developing device.

EXAMPLES

A description will be made on test results obtained by investigating a state in which the film thickness on the rear surface of the wafer of 300 mm was changed in each of a case in which, using a substrate processing apparatus having a configuration equivalent to that illustrated in FIG. 1, the Teflon film was formed through vapor deposition while keeping the height of the gap G constant, and a case in which, using the substrate processing apparatus, the Teflon film was formed through vapor deposition while changing the height of the gap G during film formation.

Comparative Example 1

Figure 14:
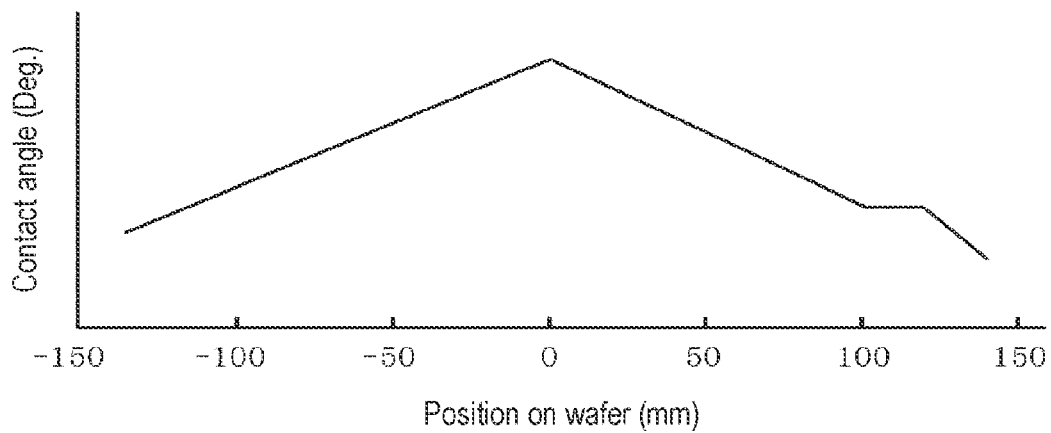
FIG. 14 is a graph schematically showing the results of test data for evaluating distribution of a film thickness in a rear surface of a substrate.

FIG. 14 shows the results obtained by supplying the raw material gas to the rear surface of the wafer at a flow rate of 1.0 liters/minute for 300 seconds in a state in which the height of the gap G is set to 0.3 mm FIG. 14 is a graph in which a position on the wafer is represented on the horizontal axis and a contact angle between water and the rear surface of the wafer is represented on the vertical axis. On the horizontal axis, zero corresponds to the position of the center of the wafer.

Comparative Example 2

Figure 15:
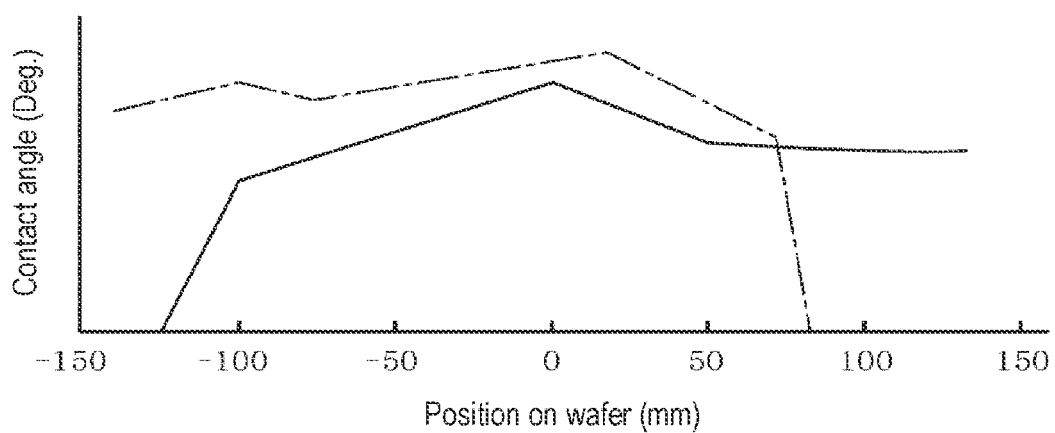
FIG. 15 is a graph schematically showing the results of test data for evaluating distribution of a film thickness in a rear surface of a substrate.

The results obtained by supplying the raw material gas to the rear surface of the wafer at a flow rate of 2.0 liters/minute for 300 seconds in a state in which the height of the gap G is set to 2.0 mm, are shown by the solid line (1) in FIG. 15.

Comparative Example 3

The results obtained by supplying the raw material gas to the rear surface of the wafer at a flow rate of 2.0 liters/minute for 300 seconds in a state in which the height of the gap G is set to 5.0 mm, are shown by the dotted line (2) in FIG. 15.

Example 1

Figure 16:
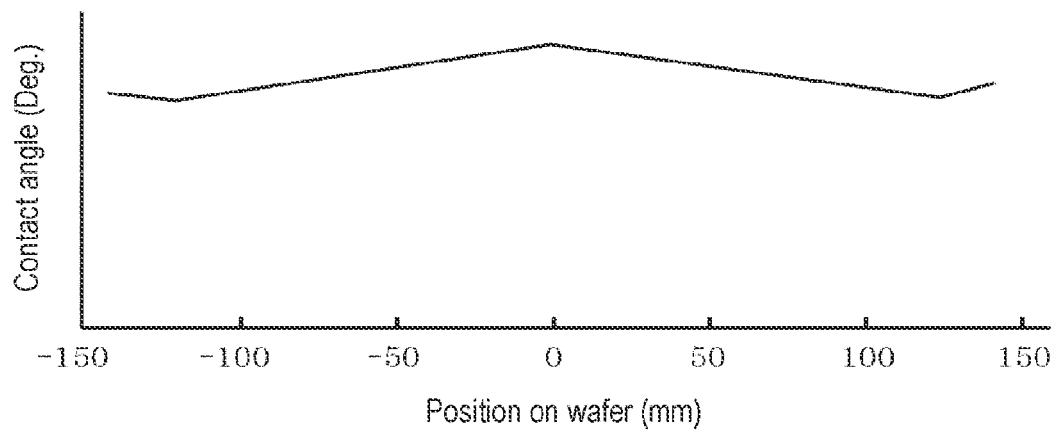
FIG. 16 is a graph schematically showing the results of test data for evaluating distribution of a film thickness in a rear surface of a substrate.

The results obtained by supplying the raw material gas to the rear surface of the wafer at a flow rate of 2.0 liters/minute for 180 seconds in a state in which the height of the gap G is set to 2.0 mm, and subsequently, supplying the raw material gas to the rear surface of the wafer at a flow rate of 1.0 liters/minute for 120 seconds in a state in which the height of the gap G is set to 0.3 mm, are shown in FIG. 16.

Reviews

Each of FIGS. 14 to 16 shows the tendency of in-plane distribution of contact angles, which is obtained by measuring the contact angles of water at a plurality of points on the rear surface of the wafer and modeling the arrangement of the measured values. The larger the film thickness of the Teflon film, the larger the contact angle. Accordingly, each of FIGS. 14 to 16 shows the film thickness distribution of the Teflon film on the rear surface of the wafer.

As can be seen from these results, when the gap G is narrowed, the vapor deposition rate in the peripheral portion of the rear surface of the wafer is low. Even if the monomolecular film is formed in the area near the center of the wafer W, vapor deposition of Teflon on a unit of molecules has not been established in the peripheral portion. As a result, the compound of carbon and fluorine, which does not reach mono-molecules, continuously adheres to the peripheral portion.

When the gap G is widened, an area where Teflon not adheres to the peripheral portion of the rear surface of the wafer, is generated. In this test, when the gap G is set to be wider, there are manifested a place to which a thin film adheres and a place to which a thin film not adheres in the circumferential direction of the wafer. This is attributed to the facts that the gas flow inside the processing container is not always constant in the circumferential direction due to a slight fluctuation in exhaust pressure or the like, and that the warping state of the wafer is not uniform in the circumferential direction.

Thus, it can be seen that, by changing the gap G, the Teflon film is formed over the entire rear surface of the wafer.

What is claimed is:

1. A substrate processing method of processing a substrate with gas inside a processing container, the substrate having a front surface on which a semiconductor device is formed, the substrate processing method comprising:
supporting a rear surface of the substrate with the front surface oriented upward by a support part, so as to form a gap between an entire rear surface of the substrate and a guide surface facing the entire rear surface;

exhausting an interior of the processing container from an exhaust port formed beyond the substrate supported by the support part along a circumferential direction of the processing container to exhaust the gas; and forming a thin film on the entire rear surface of the substrate through a vapor deposition by supplying a raw material gas from a side of the guide surface into the gap via a gas ejection port facing the rear surface and heating the raw material gas, wherein the substrate processing method includes at least one of following conditions:

(condition a) the forming the thin film includes;
  setting a height of the gap to a first value and supplying the raw material gas into the gap; and
  setting the height of the gap to a second value smaller than the first value and supplying the raw material gas into the gap, and (condition b) the forming the thin film includes changing, during the film formation, a ratio of flow rates of the raw material gas ejected from a first gas ejection port and a second gas ejection port formed at different positions on the substrate in a radial direction.

2. The substrate processing method of claim 1, wherein the substrate processing method has the condition a, and
the flow rate of the raw material gas supplied to the gap when the height of the gap is set to the first value is higher than the flow rate of the raw material gas supplied to the gap when the height of the gap is set to the second value.

3. The substrate processing method of claim 1, wherein a purge gas is supplied to the front surface of the substrate from above during the forming the thin film.

4. The substrate processing method of claim 1, wherein the substrate processing method has the condition a, and
the first value is larger than 0.5 mm and 7 mm or less, and
the second value is 0.1 mm or more and 0.5 mm or less.

5. The substrate processing method of claim 1, wherein the gas ejection port is an outlet of a gas flow path provided in a guide surface formation member having an upper surface formed as the guide surface.

6. The substrate processing method of claim 1, wherein the guide surface is a front surface of a hot plate including a heating part.

7. The substrate processing method of claim 1, wherein the forming the thin film further includes forming a monomolecular film on the rear surface of the substrate, and
wherein the thin film is a film that is deposited on the monomolecular film after the monomolecular film is formed.

8. The substrate processing method of claim 1, wherein the thin film is a thin film made of a fluororesin.

* * * * *